Feb. 23, 1971
I. J. ABEND
3,566,290
TRANSISTER FEEDBACK AMPLIFIER FOR HIGH AND LOW IMPEDANCE SIGNAL SOURCES
Filed Dec. 23, 1968
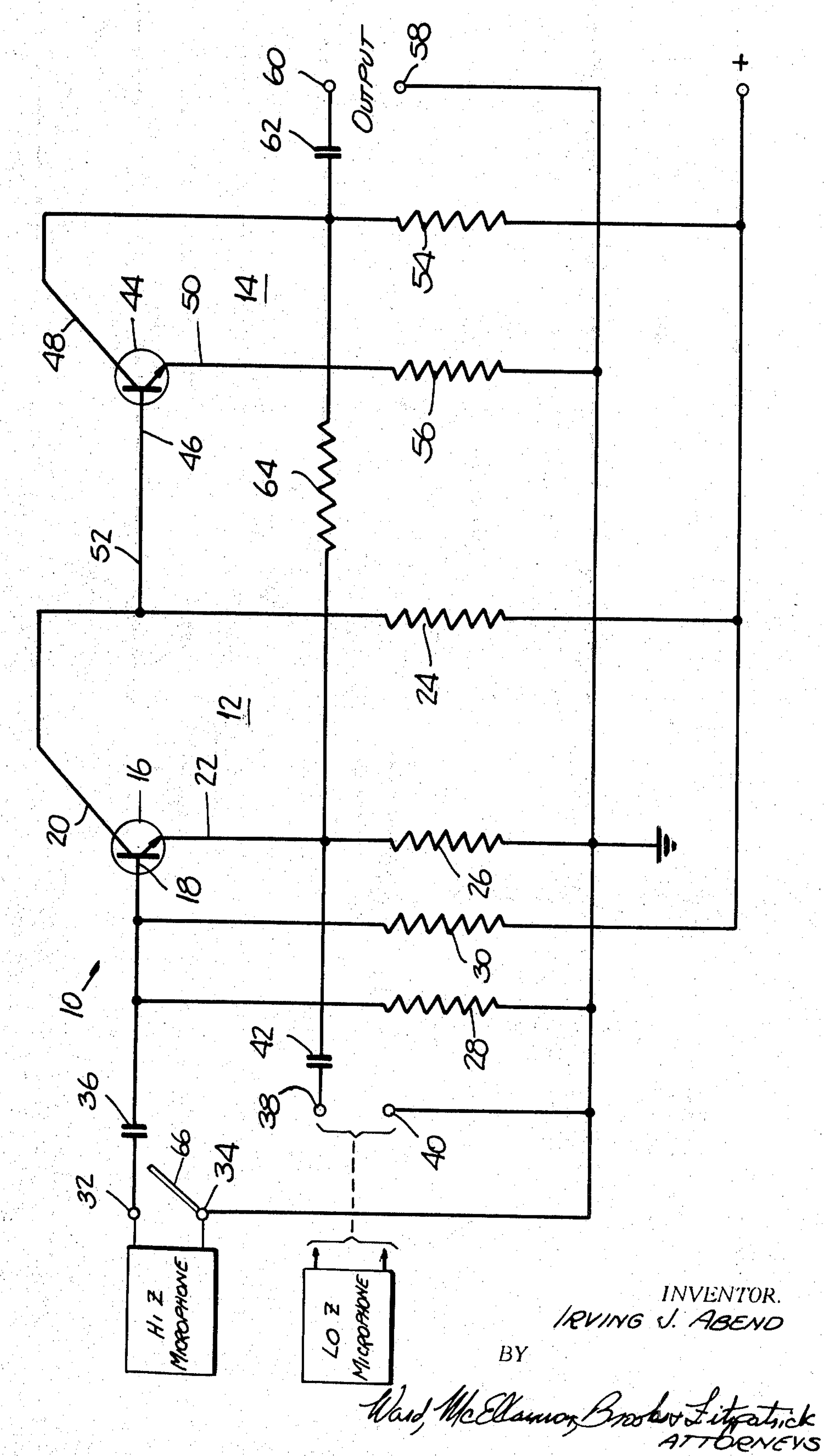
INVENTOR.
IRVING J. ABEND
BY
Ward, McElhannon, Brooks & Fitzpatrick
ATTORNEYS United States Patent Office 3,566,290
Patented Feb. 23, 1971

3,566,290

TRANSISTOR FEEDBACK AMPLIFIER FOR HIGH AND LOW IMPEDANCE SIGNAL SOURCES

Irving J. Abend, Bergenfield, N.J., assignor to Lear Siegler, Inc., Santa Monica, Calif., a corporation of Delaware Filed Dec. 23, 1968, Ser. No. 785,940
Int. Cl. H03f 1/34, 3/68
U.S. Cl. 330—19 19 Claims

ABSTRACT OF THE DISCLOSURE

An amplifier circuit, for accepting either high or low impedance sources, having two transistor stages, the transistor in the first stage operating in a common-emitter configuration when accepting a signal from a high impedance source and in a common-base configuration when accepting a signal from a low impedance source. The transistor in the second stage operates in a common-emitter configuration. Feedback is provided to set the gain of the amplifier circuit and, when used with low impedance sources, the feedback further adjusts the gain of the amplifier circuit to maintain the overall gain essentially at the same value for all levels of low input source impedance.

This invention relates to amplifier circuits, and, more particularly, it pertains to high and low input impedance amplifier circuits.

While the several aspects of the present invention have a wide range of applications, they are particularly useful in connection with microphone preamplifier circuits.

Microphone preamplifier circuits are characterized by their ability to accept inputs having a wide range of internal or source impedance and amplify these inputs with minimum distortion. Ideally, a good microphone preamplifier circuit must necessarily accept low or high impedance microphones, balanced and unbalanced, and amplify same with satisfactory gain while maintaining good signal-to-noise ratio, good dynamic range and low intermodulation and waveform distortion. In addition, and as equally important as the previously mentioned desirable characteristics, a good microphone preamplifier circuit should amplify single ended low impedance inputs with essentially the same gain over the expected low impedance input range, such as, for example, 50 to 600 ohms, without the use of a costly and otherwise undesirable impedance matching transformer.

The present invention makes possible a novel amplifier circuit arrangement which possesses all the above noted characteristics desireable in a microphone preamplifier stage. In addition, the amplifier circuit arrangement of the present invention will automatically change its gain to suit the particular source impedance when low impedance inputs are utilized so that it amplifies all contemplated low impedance inputs with essentially the same gain. Also, the amplifier circuit of the present invention is compatible with integrated circuits since it comprises only resistors and solid state devices on substrate.

In accordance with one aspect of the present invention, there is provided a high and low input impedance amplifier circuit suitable as a microphone preamplifier circuit for amplifying inputs having either a high source impedance or a relatively low source impedance within the range normally found in low impedance microphones. Specifically, the amplifier circuit of the present invention includes amplifying means having two inputs, the first input being adapted to accept high impedance inputs and the second being adapted to accept low impedance inputs. The amplifier means is preferably arranged to amplify the signals at these respective inputs with different gains. Thus, for example, the low impedance inputs may be amplified by a factor of 10 greater than that of the high impedance inputs. The amplifier circuit also includes a first input circuit means for coupling the high impedance inputs to the first input of the amplifying means, and a second input circuit means for coupling the low impedance inputs to the second input of the amplifying means. The second input circuit means is arranged to be connected across the low impedance source of inputs and is associated with the amplifying means so that the gain of the amplifier circuit is controlled in accordance with the value of source impedance thereacross. The second input circuit means and the amplifying means are relatively arranged so that the gain of amplifier circuit is selectively controlled whereby all contemplated low impedance inputs are amplified with essentially the same gain.

In accordance with another aspect of the present invention, feedback means are provided in the amplifier circuit for adjusting the gain thereof. In addition, the second input circuit means and the feedback circuit means are interconnected whereby the amplified signal feedback is divided between each, the ratio of this division determining the feedback ratio of the amplifier circuit and thus the gain thereof. Thus, changes in source impedance across the second input circuit means will also change the feedback ratio, and, in turn, the gain of the amplifying means.

In accordance with another aspect of the present invention, the amplifying means is defined by a two stage transistor amplifier. The first stage includes a first transistor suitably arranged so that the first stage operates at low current level thus providing good signal-to-noise ratio for the amplifier circuit. The second stage includes a second transistor suitably arranged so that it presents a relatively high or matching impedance to the first stage and a relatively low output impedance for cable connections to power amplifiers and the like. In addition, the first stage is arranged to define a common emitter configuration with respect to the high impedance input and a common base configuration with respect to the low impedance input. Feedback circuit means are provided between the collector of the second transistor and the emitter of the first transistor and are arranged so that the overall gain of the amplifier circuit is adjusted as described above for all low level impedance inputs and to provide different gains for the high and low impedance inputs respectively.

There have thus been outlined rather broadly the more important features of the invention in order that the detailed description thereof that follows may be better understood, and in order that the present contribution to the art may be better appreciated. There are, of course, additional features of the invention that will be described hereinafter and which will form the subject of the claims appended hereto. Those skilled in the art will appreciate that the conception upon which this disclosure is based may readily be utilized for the designing of other structures for carrying out the several purposes of the invention. It is important, therefore, that the claims be regarded as including such equivalent constructions as do not depart from the spirit and scope of the invention.

A specific embodiment of the invention has been chosen for purposes of illustration and description, and is shown in the accompanying drawings wherein the single figure shows a schematic circuit diagram of a high and low input impedance microphone amplifier circuit constructed in accordance with the present invention and arranged for high input impedance operation.

As shown in the single figure of the drawings, the high and low input impedance microphone amplifier circuit, shown generally at 10, comprises two stages of amplification, and includes a first stage shown generally at 12 and a second stage shown generally at 14. The first stage 12 is operate at low current level for low noise operation and is DC coupled to the second stage 14. The second stage 14 is arranged so as to present a high impedance to the first stage to properly match the second stage 14 to the first stage 12 and is arranged to provide a low output impedance for cable connection to power amplifiers and mixers etc.

The first stage 12 utilizes a transistor 16, having a base 18, a collector 20 and an emitter 22, for amplifying the inputs to the circuit 10. The collector 20 is connected through a load resistance 24 to a suitable positive power supply referenced to ground, and the emitter 22 is connected through an emitter resistance 26 to ground. Stabilizing resistors 28 and 30 are connected between the base 18 and ground and the positive power source respectively. As shown in the drawings, the first stage 12 has two inputs thereto for supplying high and low impedance inputs to the amplifier circuit. The high impedance input is connected across terminals 32 and 34 which are connected through a blocking capacitor 36 to the base 18 of the transistor 16 and to ground potential, respectively. The low impedance input is connected across terminals 38 and 40 which are connected through a blocking capacitor 42 to the emitter 22 of the transistor 16 and ground potential, respectively.

The second stage 14 of the amplifier circuit includes a transistor 44, having a base 46, a collector 48 and an emitter 50, and which is coupled to the first stage 12 by a lead 52 connecting the collector 20 of the transistor 16 to the base 46 of transistor 44. The collector 48 of transistor 14 is connected through a load resistor 54 to the positive supply voltage; and the emitter 50 of transistor 44 is connected through an emitter resistor 56 to ground potential. The output of the second stage is taken across terminals 58, 60 which are connected respectively to ground and to the collector 48 through a blocking capacitor 62. In addition to the direct coupling between the first stage 12 and the second stage 14 provided by the lead 52, the stages are interconnected by a feedback resistor 64 which couples the collector 48 of transistor 44 to the emitter 22 of transistor 16.

As stated previously, the first stage 12 is desirably operated at low collector current since under these conditions the transistor 16 is less subject to large variations in internal noise with base to emitter impedance variations, and thus the signal-to-noise ratio of this stage is maintained at its lower level within the capability of the transistor 16. To this end, the value of the load resistor 24 of the first stage is chosen so as to maintain the collector current of transistor 16 at a very low level such as, for example, 10 to 100 microamperes. Since the value of load resistor 24 must be high in order to maintain the current level in the first stage at this low value, the input impedance presented by the second stage 14 must be of a similar or corresponding value so as not to shunt the load resistor 24 to the extent that gain and dynamic range of the amplifier circuit will be reduced. Accordingly, the input impedance of the second stage 14 is made high both by using an unbiased emitted resistor 56 and by establishing the gain of the second stage 14 at a very low value by the proper adjustment of the resistance ratio between load resistor 54 and emitter resistor 56. Under this arrangement, the amplifier circuit 10 will have a very good signal-to-noise ratio since the first stage 12 contributes most of the overall gain, and will amplify input signals to a level well above the effective noise level of the second stage. Also, because of the negative feedback provided by the feedback resistor 64, the output impedance of the second stage 14 will be desirably low, thus providing a suitable output impedance adaptable for cable runs to power amplifiers, mixers, etc.

In high input impedance operation, the input is coupled across the terminals 32 and 34 and is applied between the base 18 of the transistor 16 and ground while the terminals 38 and 40 remain open. Thus, in high impedance operation, the first stage 12 is arranged in a common emitter configuration. The high impedance input to the first stage 12 is amplified in the first stage and is coupled through the lead 52 to the second stage 14 and then through the blocking capacitor 62 to the output terminals 58, 60.

A portion of the voltage appearing at the collector 48 of the transistor 44 in the second stage 14, is coupled back to the first stage 12 by means of a voltage divider defined by the feedback resistor 64 and the emitter resistor 26 of the first stage 12. The ratio of the resistance values of resistors 64 and 26 is chosen so that the feedback ratio of the overall amplifier circuit, when operating with high impedance inputs, is such as to maintain the overall gain of the circuit at suitable preamplifier level; typically these gains may range between 20 and 60.

For low impedance input operation, the high impedance input terminals 32, 34, are shorted by any known means, such as by the switch 66 shown in the drawings; and the low impedance inputs are connected across the terminals 38 and 40. With this arrangement, the base 18 of the transistor 16 is connected to ground and thus the first stage 12 is arranged in essentially a grounded base configuration. The low impedance input signals are coupled through the blocking capacitor 42 and applied across the emitter resistor 26. These inputs are then amplified in the first stage 12 and second stage 14 and coupled through the blocking capacitor 62 across the output terminals 58, 60.

As in high input impedance operation, during low input impedance operation a portion of the voltage appearing at collector 48 of the transistor 44 is fed back through the voltage divider formed by the feedback resistor 64 and the emitter resistor 26, and is coupled to the emitter 22 of the transistor 16 to vary the overall gain of the amplifier circuit. The low source impedance of the input appears directly across the resistor 26 to change the effective resistance between the emitter 22 of the transistor 16 and ground. This change in resistance between the emitter 22 of the transistor 16 and ground changes the ratio of the voltage divider formed by the resistor 64 and resistor 26, thus also changes the overall gain of the amplifier circuit for a low impedance operation. Typically, the change in this ratio should be adjusted so that the overall gain of the amplifier circuit is within the range of 200 to 600.

With the low impedance input arrangement described above, the amplifier circuit 10 automatically changes its gain when used with low impedance microphones to gain requirements of the particular low impedance input used. Thus, any change in the input impedance across resistor 26 will also change the overall gain of the amplifier circuit 10 depending, of course, on the particular value of the input impedance as this change will also change the feedback ratio of resistors 64 and 26. Thus, the amplifier circuit 10 will accept any low impedance microphone and automatically change its gain to provide the proper output level, signal-to-noise ratio and dynamic capability.

As stated above, the overall gain of the two stages 10 and 14 is controlled by the resistance ratio of the resistors 26 and 64. Preferably, this ratio is fixed to provide a fixed gain, and the microphone stage gain is controlled by means of a potentiometer volume control (not shown) connected across the output leads 58, 60. In some cases, however, resistance values of the resistor 64 and/or resistor 26 may be adjusted to control the gain of the amplifier circuit 10, especially when an extremely wide dynamic range input signal causes overloading. This is preferably done by replacing feedback resistor 64 with a variable resistor or with a combination of a fixed and variable resistor.

Thus, it will be appreciated that the amplifier circuit 10 disclosed above possesses all of the characteristics necessary for a microphone preamplifier stage in that it accepts input signals from input devices which have a wide range of internal impedance; and it amplifies these inputs with minimum distortion. In addition, when the low impedance input is used, the amplifier circuit 10 will automatically change gain to suit the internal impedance of this low impedance source. Also, since only resistors and solid state devices are needed, the circuit particulars are compatible with integrated circuit usage.

While many circuit parameters may be chosen in the realization of the preferred embodiment described above, the following values have been found satisfactory.

| Element | Identification | Value |
|---|---|---|
| 16 | Transistor | 2 N5089. |
| 24 | Resistor | 470K ohms. |
| 26 | do | 2.2K ohms. |
| 28 | do | 220K ohms. |
| 30 | do | 3.9 meg. ohms. |
| 36 | Capacitor | .1 farad. |
| 42 | do | 100 microfarads. |
| 44 | Transistor | 2 N5089. |
| 54 | Resistor | 8.2K ohms. |
| 56 | do | 3.3K ohms. |
| 62 | Capacitor | .1 farad. |
| 64 | Resistor | 68K ohms. |

What is claimed and desired to be secured by Letters Patent is:

1. An amplifying circuit for amplifying an input from a source having a source impedance within a low predetermined range, said circuit comprising amplifying means for amplifying said input, and input circuit means arranged to be connected across said source for coupling said input to said amplifying means, said input circuit means being interconnected to said amplifying means to control the gain of said amplifying means in relation to the value of the source impedance across said input circuit means and cause said amplifying circuit to amplify all inputs having source impedances within said predetermined range with essentially the same gain.

2. An amplifying circuit as in claim 1 wherein feedback circuit means are associated with said input circuit means and said amplifying means for controlling the gain thereof, and wherein said input circuit means and said feedback circuit means are interconnected such that value of the source impedance across said input circuit means adjusts the amount of feedback provided by said feedback circuit means.

3. A low input impedance amplifier circuit for processing an input from a source having a low source impedance within a predetermined range, said amplifier circuit comprising means for amplifying said input, input circuit means arranged to be connected across said source and for coupling said input to said amplifying means, and feedback circuit means associated with said amplifier means for feeding back a portion of the amplified input to the input of said amplifying means, said input circuit means and said feedback circuit means being interconnected such that the amount of feedback provided by said feedback circuit means is controlled by said source impedance across said input circuit means to cause the gain of said amplifying means to automatically vary for all inputs within said predetermined range to provide outputs with essentially the same gain.

4. A low input impedance amplifier as in claim 3 wherein said input circuit means and said feedback circuit means are interconnected to form a divider circuit between the amplifying means and the input thereof, the ratio of said divider circuit determining the amount of feedback to the input of said amplifying means whereby the source impedance across said input circuit means adjust said ratio of said divider circuit to amplify all low impedance inputs within said predetermined range with essentially the same gain.

5. A low input impedance amplifier as in claim 4 wherein said input circuit means and said feedback circuit means are serially connected and wherein the input of said amplifier means is connected to the serial connection between said input circuit means and said feedback circuit means.

6. A low input impedance amplifier as in claim 3 wherein said amplifying means comprises at least two stages, the first stage being arranged to quiescently operate at relatively low current levels and the second stage being arranged to have a high input impedance and a relatively low output impedance.

7. A high and low input impedance amplifier for amplifying signal sources having either a high source impedance or relatively low source impedance within a predetermined impedance range, said amplifier comprising amplifying means having two inputs, one input being adapted to accept said signal sources having high source impedance and the other being adapted to accept said signal sources having low source impedance within said predetermined range, first input circuit means for coupling high impedance signals to said first input, second input circuit means arranged to be connected across said source of low impedance signals and couple same to said second input and said second input circuit means being connected in said amplifying means so that same controls the gain of said amplifying means in response to the value of the source impedance thereacross whereby said amplifier readily accepts low or high impedance signal sources and amplifies low impedance signal sources within said predetermined range with essentially the same gain.

8. A high and low input impedance amplifier as in claim 7 wherein said amplifier means is arranged to provide different gains for said high and low impedance signals and wherein feedback circuit means are provided in said amplifier means for adjusting the gain thereof.

9. A high and low input impedance amplifier as in claim 8 wherein said second input circuit means is interconnected with said feedback circuit means such that the amount of feedback provided by said feedback circuit means is adjusted by the low impedance source across said second input whereby the gain of said high and low input impedance amplifier is automatically varied for each low impedance input within said predetermined range to provide outputs with essentially the same gain.

10. A high and low input impedance amplifier as in claim 9 wherein said second input circuit means and said feedback circuit means are interconnected to form a divider circuit between the amplifying means and the input thereof, the ratio of said divider circuit determining the amount of feedback to the input of said amplifier means whereby the source impedance across said second input circuit means adjusts said ratio to amplify all low impedance inputs within said predetermined range with essentially the same gain.

11. A high and low input impedance amplifier as in claim 10 wherein said second input circuit means and said feedback circuit means are serially connected and wherein the second input of said amplifying means is connected to the serial connection between said input circuit means and said feedback circuit means.

12. A high and low input impedance amplifier as in claim 11 wherein said amplifying means comprises at least two stages, the first stage being arranged to quiescently operate at relatively low current levels and the second stage being arranged to have a high input impedance and a relatively low output impedance.

13. A low and high input impedance amplifier circuit for amplifying either high or low impedance signal sources, said low impedance source being within a predetermined impedance range, said amplifier circuit comprising first input means for supplying said high impedance signals, second input means adapted to be connected across said low impedance signal source and for supplying said low impedance signals, a first transistor amplifier stage including a first transistor having at least base, collector and emitter electrodes, said first and second input circuit means being connected to said first transistor amplifier stage between a common circuit reference point and different ones of said electrodes of said first transistor, said first transistor amplifier stage being arranged to operate at low current level through said first transistor thereby maintaining low noise level in said high and low input impedance amplifier circuit, a second transistor amplifier stage connected to said first stage and arranged to present a relatively high impedance thereto and a relatively low output impedance, and feedback circuit means associated with said second transistor amplifier stage for feeding back a portion of its output to said first stage, said feedback circuit means and said second input circuit means being interconnected with said first transistor stage such that the amount of feedback provided by said feedback circuit is controlled by the value of said low input impedance across said second input circuit means.

14. A high and low input impedance amplifier circuit as in claim 13 wherein said second input circuit means and said feedback circuit means are interconnected to form a divider circuit between the second stage and the first stage, the ratio of said divider circuit determining the amount of feedback to the first stage whereby the source impedance across said second input circuit means adjusts said ratio to amplify all low level inputs within said predetermined range with essentially the same gain.

15. A high and low input impedance amplifier as in claim 14 wherein said second input circuit means and said feedback circuit means are serially connected and wherein the second input of said first stage is connected to the serial junction between said second input circuit means and said feedback circuit means.

16. A high and low input impedance as in claim 13 wherein said first input circuit means is connected between said base electrode of said first transistor and said common reference point and wherein said second input circuit means is connected between said emitter electrode of said first transistor electrode and said common reference point, and said feedback circuit means includes impedance means connected between said second transistor amplifier stage and said emitter electrode of said first transistor.

17. A high and low input impedance amplifier as in claim 16 wherein said second transistor amplifier stage includes a second transistor having at least base, collector and emitter electrodes, said emitter electrode of the second transistor being connected through impedance means to said common reference point and said collector of same being connected through a load impedance and power supply means to said common reference point while said base electrode of said second transistor being connected to the collector electrode of said first transistor whereby said second stage presents a high impedance to said first stage and provides a relatively low output impedance.

18. A high and low input impedance amplifier as in claim 16 wherein said second transistor amplifier stage includes a second transistor having a collector electrode, wherein said second input circuit means includes first resistance means connected between the emitter electrode of said first transistor and said common reference point and wherein said feedback circuit means includes second resistance means connected between said collector electrode of said second transistor and the emitter electrode of the first transistor, the ratio of feedback across said first and second resistance means defining the feedback ratio of the amplifier circuit.

19. A method of amplifying with essentially the same gain, inputs having low source impedances within a predetermined range, said method comprising coupling said inputs to an amplifying means, feeding back a portion of the amplified input from the amplifying means and automatically adjusting the amount of feedback in relation to the value of the source impedance at the input of said amplifying means so as to maintain the overall gain constant for all values of impedance within said predetermined range.

References Cited

UNITED STATES PATENTS

| | | | |
|---|---|---|---|
| 2,760,007 | 8/1956 | Lozier | 330—28X |
| 3,026,380 | 3/1962 | Reher et al. | 330—28X |
| 3,040,265 | 6/1962 | Forge | 330—20X |
| 3,124,759 | 3/1964 | Dahlberg | 330—19 |

JOHN KOMINSKI, Primary Examiner

S. H. GRIMM, Assistant Examiner

U.S. Cl. X.R.

330—20, 28, 30, 106, 147